(12) United States Patent
Wakker et al.

(10) Patent No.: US 7,808,612 B2
(45) Date of Patent: Oct. 5, 2010

(54) LITHOGRAPHIC APPARATUS AND METHOD FOR MASKING A SUBSTRATE

(75) Inventors: Remko Wakker, Eindhoven (NL); Erik Marie Jose Smeets, Prinsenbeek (NL)

(73) Assignee: ASML Netherlands B.V., Veldhoven (NL)

(*) Notice: Subject to any disclaimer, the term of this patent is extended or adjusted under 35 U.S.C. 154(b) by 521 days.

(21) Appl. No.: 11/783,113

(22) Filed: Apr. 5, 2007

(65) Prior Publication Data

US 2008/0246935 A1      Oct. 9, 2008

(51) Int. Cl.
*G03B 27/42*     (2006.01)
*G03B 27/52*     (2006.01)

(52) U.S. Cl. ............ 355/30; 355/53; 355/72; 355/75; 355/77; 414/935

(58) Field of Classification Search .......... 355/53, 355/72, 77, 30, 75; 250/515.1, 492.2; 359/361; 414/805, 411, 416.01, 416.03, 416.12, 935, 414/941
See application file for complete search history.

(56) References Cited

U.S. PATENT DOCUMENTS

| | | | |
|---|---|---|---|
| 5,361,121 A | 11/1994 | Hattori et al. ............ 355/50 |
| 5,760,881 A | 6/1998 | Miyazaki et al. .......... 355/71 |
| 6,078,381 A | 6/2000 | Suzuki ..................... 355/53 |
| 6,400,445 B2* | 6/2002 | Nishi et al. ............... 355/72 |
| 6,680,774 B1 | 1/2004 | Heinle ...................... 355/72 |
| 6,680,775 B1* | 1/2004 | Hirakawa ................. 355/75 |
| 6,822,730 B2* | 11/2004 | Krikhaar et al. .......... 355/72 |
| 6,906,783 B2* | 6/2005 | del Puerto et al. ........ 355/53 |
| 7,551,265 B2* | 6/2009 | Phillips .................... 355/75 |
| 2003/0215578 A1* | 11/2003 | Okumura et al. ......... 427/569 |
| 2007/0242242 A1* | 10/2007 | Nagasaka et al. ......... 355/53 |

* cited by examiner

*Primary Examiner*—Hung Henry Nguyen
*Assistant Examiner*—Colin Kreutzer
(74) *Attorney, Agent, or Firm*—Pillsbury Winthrop Shaw Pittman LLP

(57) ABSTRACT

A method of removing a substrate from a substrate table of a lithographic apparatus. The substrate table is provided with a mask arranged to form a peripheral exposure exclusion region on a substrate. The method includes moving the mask from an in use position to a storage position. The storage position is adjacent to a projection system of the lithographic apparatus. The method also includes removing the substrate from the lithographic apparatus.

5 Claims, 13 Drawing Sheets

US 7,808,612 B2

LITHOGRAPHIC APPARATUS AND METHOD FOR MASKING A SUBSTRATE

FIELD

The present invention relates to lithographic apparatus and method for masking a substrate and particularly to apparatus and a method for forming a peripheral exposure exclusion region on a surface of a photosensitive substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

U.S. Pat. No. 6,680,774 discloses a method and apparatus for mechanically masking a substrate to form exposure exclusion regions. Masking in this sense refers to blocking radiation. This is done using a mask which is opaque to the wavelength of radiation used by the lithographic apparatus. The term "mask" used in this context has a different meaning from the conventional meaning in lithography, and refers to device which is used to block radiation rather than to pattern radiation. The mask is arranged to overlie a predetermined exposure exclusion region of a photosensitive surface of a substrate. The mask is positioned over the substrate prior to exposure of the substrate, thereby shielding the regions of the photosensitive surface underlying the mask.

Also disclosed in U.S. Pat. No. 6,680,774 is a mask handling system having motorized base from which a beam extends. The beam may be raised, lowered and rotated. Mounted on the distal end of the beam are three arms. Each arm has a contact member, and these collectively engage a mask to load it into position on the substrate. However, in loading the mask into its correct position, the mask passes over the underlying substrate thereby directly exposing regions of the photosensitive surface thereto. This is undesirable in that debris may fall onto the substrate and contaminate the photosensitive surface of the substrate. In addition, loading the mask into the lithographic apparatus may introduce contamination into the lithographic apparatus.

It is desirable to provide a method and apparatus which obviate or mitigate one or more of the problems of the prior art, whether identified herein or elsewhere.

SUMMARY

According to an aspect of the invention, there is provided a method of removing a substrate from a substrate table of a lithographic apparatus. The substrate table is provided with a mask arranged to form a peripheral exposure exclusion region on a substrate. The method includes moving the mask from an in use position to a storage position. The storage position is adjacent to a projection system of the lithographic apparatus. The method also includes removing the substrate from the lithographic apparatus.

According to a further aspect of the invention, there is provided a lithographic apparatus that includes a projection system arranged to project patterned radiation onto a substrate, a substrate table arranged to support the substrate, a mask arranged to form a peripheral exposure exclusion region on the substrate, and one or more actuators arranged to move the mask from an in use position to a storage position, the storage position being adjacent to the projection system.

According to a still further aspect of the invention, there is provided a method of loading a peripheral exposure exclusion mask into a lithographic apparatus. The method includes delivering a carrier containing the mask into the lithographic apparatus, removing the mask from the carrier, and positioning the mask relative to a substrate table of the lithographic apparatus so that the mask will prevent a peripheral region of a substrate from being exposed during subsequent lithographic patterning of the substrate.

According to a still further aspect of the invention, there is provided a lithographic apparatus that includes a projection system arranged to project patterned radiation onto a substrate, a substrate table arranged to support the substrate, a mask arranged to form a peripheral exposure exclusion region on the substrate, and one or more actuators located in a suspension plate disposed above the substrate table. The actuators are arranged to be releasably attached to a cover of the carrier and to the mask.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
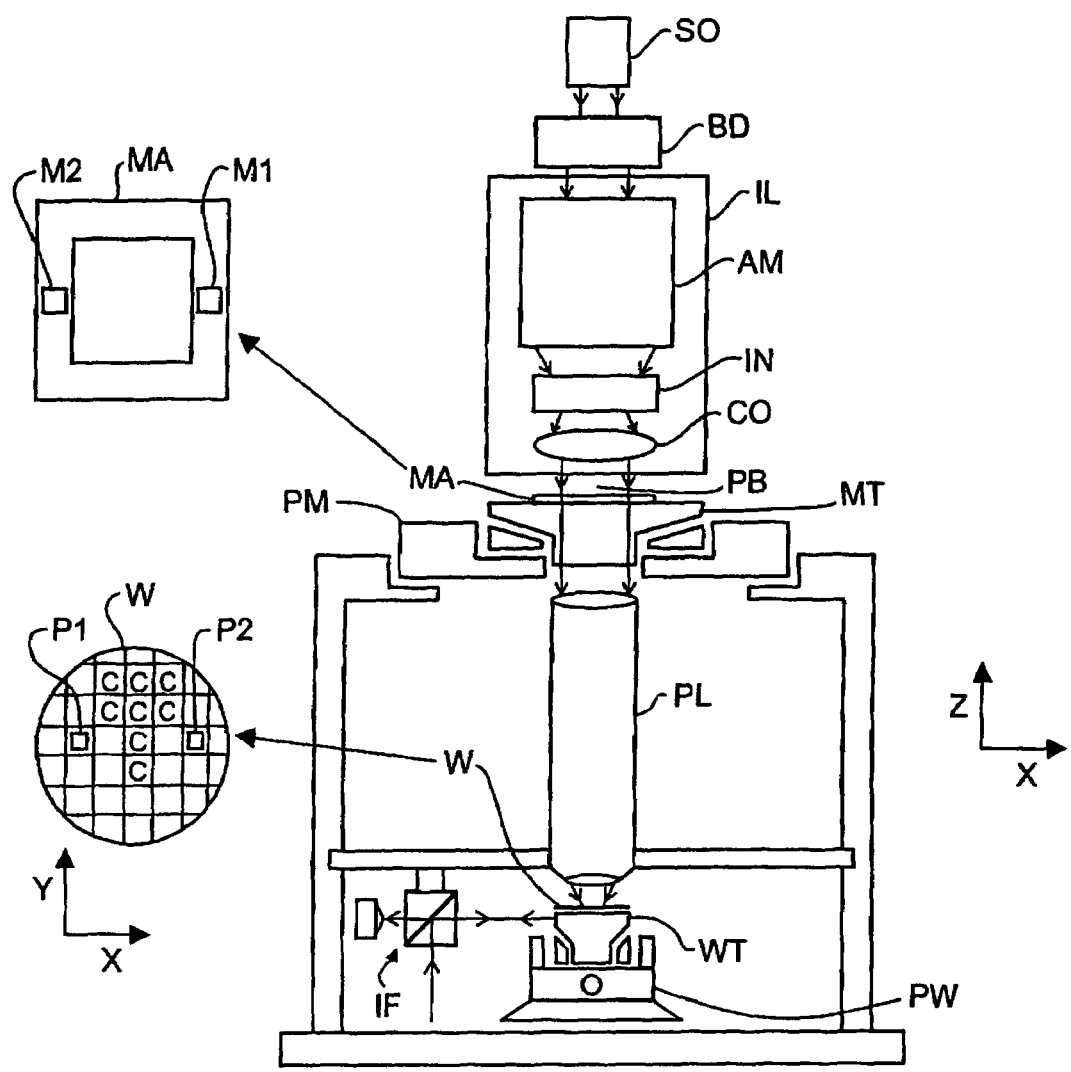
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include so called masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. The term 'patterning device' is used in this description in preference to the word 'mask'. In subsequent parts of the description the term 'mask' is used to refer to a device which blocks radiation rather than patterning it. The verb 'masking' is used to refer to the act of blocking radiation rather than patterning it.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as needed and which may ensure that the patterning device is at a desired position, for example with respect to the projection system.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic apparatus. The apparatus comprises: an illumination system (illuminator) IL to condition a beam PB of radiation (e.g. UV radiation); a support structure (e.g. a support structure) MT to support a patterning device MA and connected to first positioning device PM to accurately position the patterning device with respect to item PL; a substrate table (e.g. a wafer table) WT for holding a substrate (e.g. a resist-coated substrate) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if needed, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device MA, which is held on the support structure MT. Having traversed the patterning device MA, the beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
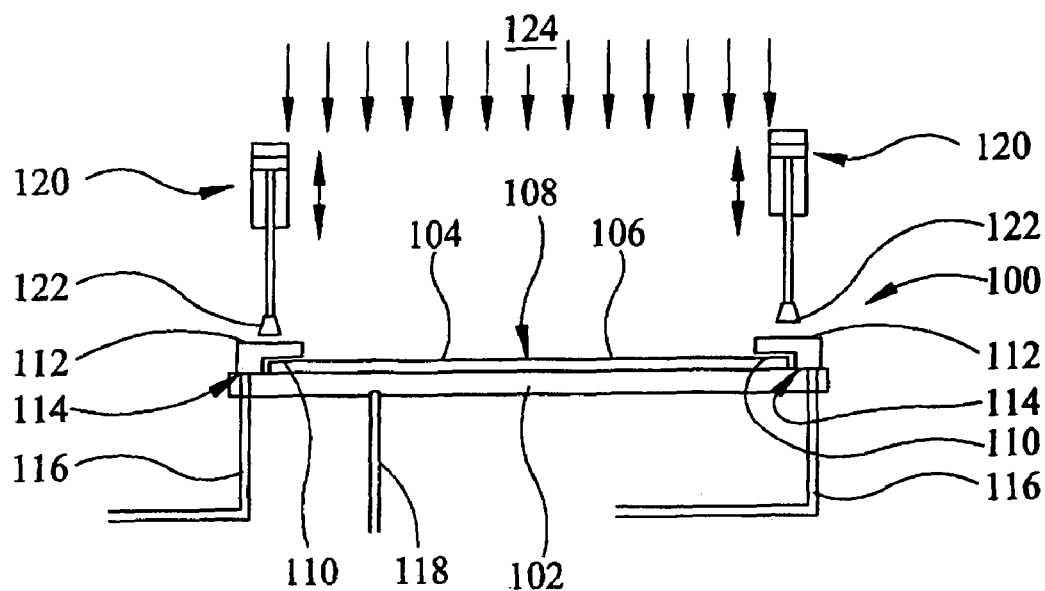
FIG. 2 is a schematic drawing of a first embodiment of masking apparatus, and a method of masking, according to the present invention.

Referring to FIG. 2, a first embodiment of the apparatus 100, according to the present invention, comprises a substrate table 102 for supporting a substrate 104. The substrate comprises an upper surface having a photosensitive layer 106. The photosensitive layer 106 has exposure regions 108 and a peripheral exposure exclusion region 110.

The apparatus further comprises a mask 112 which, in use, rests on the substrate table 102 on a peripheral region 114 thereof. The mask 112 is in the form of a ring, but in other examples it may be in the form of an arcuate blade-like member. However, it will be appreciated that the mask may be of any other form depending on the application. The mask 112 is opaque to the wavelength of radiation used by the lithographic apparatus. The mask is positioned to overlie the peripheral exposure exclusion region 110 of the substrate. The mask 112 acts to prevent the radiation beam of the lithographic apparatus being incident on the exclusion region 110 of the substrate. The mask 112 is positioned so that it does not touch the photosensitive layer 106. The mask 112 is close to the photosensitive layer so that the penumbra that it casts is small.

The substrate table 102 comprises a mask clamp 116, for clamping the mask 112 thereto. The mask clamp 116 may, for example, be either a vacuum actuator or an electromagnetic actuator. The mask clamp 116 is operable to provide a clamping force around the peripheral region 114 of the substrate table directly underlying the peripheral region on which the mask 112 rests in use. For example, where the mask 112 is in the form of a ring the mask clamp 116 is operable to provide a clamping force around the circumference of the peripheral region 114, underlying the loaded mask.

The description of this embodiment of the invention refers to vacuum actuators at various points, as do the descriptions of other embodiments of the inventions. Where this is done, the vacuum actuators are mentioned as examples. Other types of actuators, for example electromagnetic actuators, may be used.

The substrate table 102 further comprises a substrate clamp 118, for clamping the substrate 104 thereto. The substrate clamp 118 is a vacuum actuator and is operable to be active in the region of the substrate table which underlies a loaded substrate.

The mask clamp 116 and the substrate clamp 118 have servos (not shown) which are located in the substrate table.

The apparatus 100 further comprises a mask holder 120. The mask holder 120 has two storage actuators 122 disposed above the mask 112 and diametrically opposed to each other. It will be appreciated that more or less storage actuators may be used, within the working of the present invention, depending on the specific application.

The storage actuators 122 may be vacuum actuators or electromagnetic actuators. Each storage actuator 122 is operable to travel in a direction perpendicular to the plane on which the substrate table 102 lies. It is not essential that the storage actuators 122 travel perpendicularly to the substrate table 102. They may for example include some lateral movement, for example some translation or rotation of the mask 112 in the xy plane. This may occur for example due to engineering tolerances in the actuators. Where lateral movement of the mask 112 occurs, the position of the substrate table 102 may be adjusted to take into account that movement. This may be done for example when the mask 112 is being lowered onto the substrate table 102.

In use, in the position of the apparatus in FIG. 1, the substrate 104 and mask 112 are exposed to radiation 124 (e.g. UV radiation) thereby activating the exposure region 108 of the photosensitive layer 106. The mask 112 prevents exposure of the peripheral exposure exclusion region 110 thereby ensuring that the photosensitive surface lying thereunder is not activated.

From the position of the apparatus shown in FIG. 1, the mask 112 is moved to a storage position by lowering the storage actuators 122 onto the mask 112. The storage actuators 122 are actuated such that a vacuum or electromagnetic force attaches the mask 112 to the storage actuators 122. The mask is then lifted clear of the substrate table 162 and substrate 104, in a direction perpendicular thereto. The mask is moved to a storage position, which is adjacent to a projection system of the lithographic apparatus (not shown in FIG. 2). The mask is lifted perpendicularly from the substrate table, it does not pass over the substrate. This reduces the likelihood of debris dropping off the mask and onto the substrate (such debris would damage the pattern projected onto the substrate). The term 'adjacent to a projection system' is not intended to be limited to positions in which the mask is in contact with the projection system. It may be interpreted to mean that the mask 112 is moved to a plane which is closer to the projection system than it is to the substrate table, or to a plane which intersects with the projection system.

Once the mask 112 has been moved to the storage position, the substrate may be removed from the substrate table 102. A new substrate may then be placed on the substrate table. The mask 112 is then lowered onto the substrate table 102. The mask clamp 116 is used to clamp the mask 112 to the substrate table 102. Once this has been done, projection of a pattern onto the substrate may take place.

Figure 3:
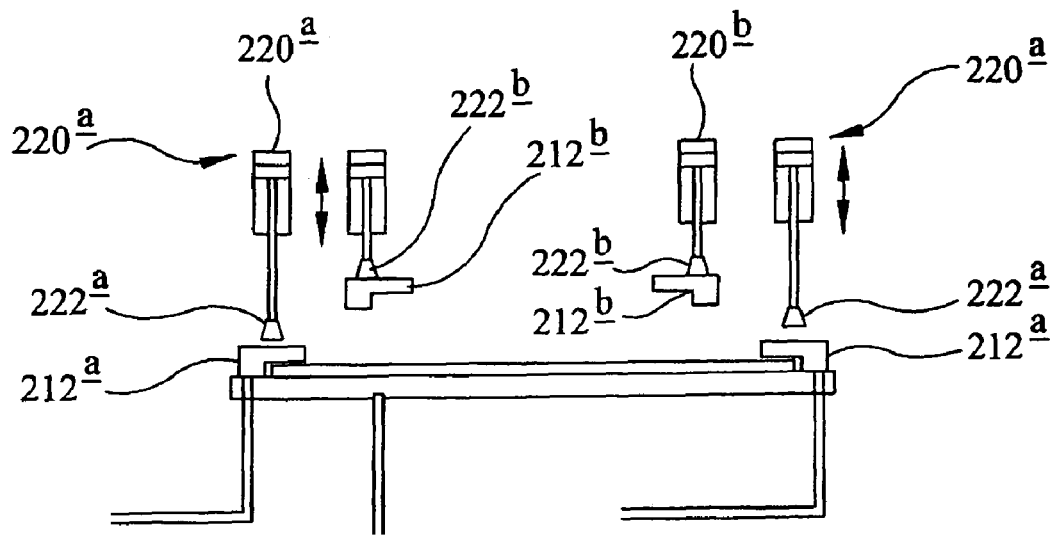
FIG. 3 is a schematic drawing of a second embodiment of masking apparatus, and a method of masking, according to the present invention.

Referring to FIG. 3, apparatus according to a second embodiment of the present invention has a first mask 212*a* and a second mask 212*b*. Each mask, 212*a* and 212*b*, has an associated mask holder, 220*a* and 220*b*, with each mask holder having storage actuators 222*a* and 222*b*, respectively.

The first and second masks, 212*a* and 212*b*, are of a different size in diameter both internally and externally for use with different size substrates or for different areas of exposure exclusion regions. For example, the first mask 212*a* is for use with a 12 inch (300 mm) diameter substrates and the second mask is for use with 8 inch (200 mm) diameter substrates.

In use, the apparatus of the second embodiment functions in the same way as the apparatus of the first embodiment, except that when the first mask 212*a* is in use the second mask 212*b* is in a storage position, as shown in FIG. 2, and vice versa.

Figure 4:
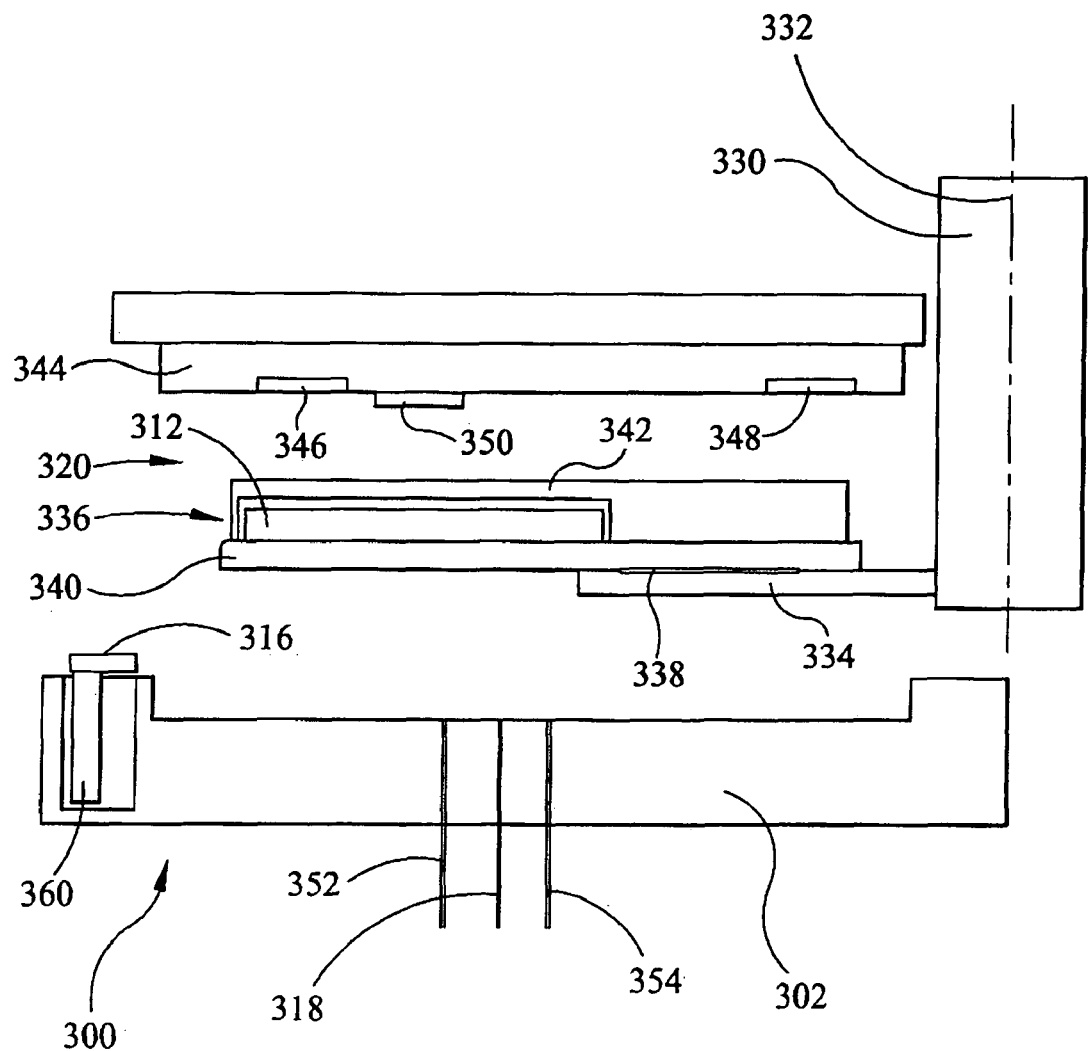
FIGS. 4 to 13 are schematic drawings of a third embodiment of masking apparatus, and a method of masking, according to the present invention.

Referring to FIG. 4, apparatus 300 according to a third embodiment of the present invention comprises a substrate table 302 for supporting a substrate (not shown).

The apparatus further comprises a mask 312 which, in use, rests on the substrate table 302 on a peripheral region 314 thereof. However, in FIG. 4 the apparatus is shown in the process of loading/unloading a mask 312, which is further described below. In this embodiment the mask 312 is in the form of a blade, but in other examples it may be in the form of a ring. However, it will be appreciated that the mask may be of any other form depending on the application.

The substrate table 302 comprises a mask clamp 316, for clamping the mask 312 thereto. The mask clamp 302 may, for example, be either a vacuum actuator or an electromagnetic actuator, and is operable to provide a clamping force around the peripheral region 314, of the substrate table, directly underlying the peripheral region on which the mask 312 rests in use. For example, where the mask 312 is in the form of a ring the mask clamp 316 is operable to provide a clamping force around the circumference of the peripheral region 314, underlying the loaded mask.

The substrate table 302 further comprises a substrate clamp 318, for clamping a substrate thereto. The substrate clamp 318 is a vacuum actuator and is operable to be active in the region of the substrate table which underlies a loaded substrate.

The apparatus 300 further comprises a mask loader 320. The mask loader 320 has an upright member 330, which is disposed to a side of the substrate table 302. The upright member 330 is rotatable about it's own longitudinal axis 332 and has an arm 334 extending radially outwards therefrom. The arm 334 is located above the substrate table by rotating the upright member 330.

The mask loader 320 further comprises a mask carrier 336. The mask carrier 336 is disposed on an upper side of the arm 334 and is held in position on the arm by a vacuum actuator 338.

Figure 5:
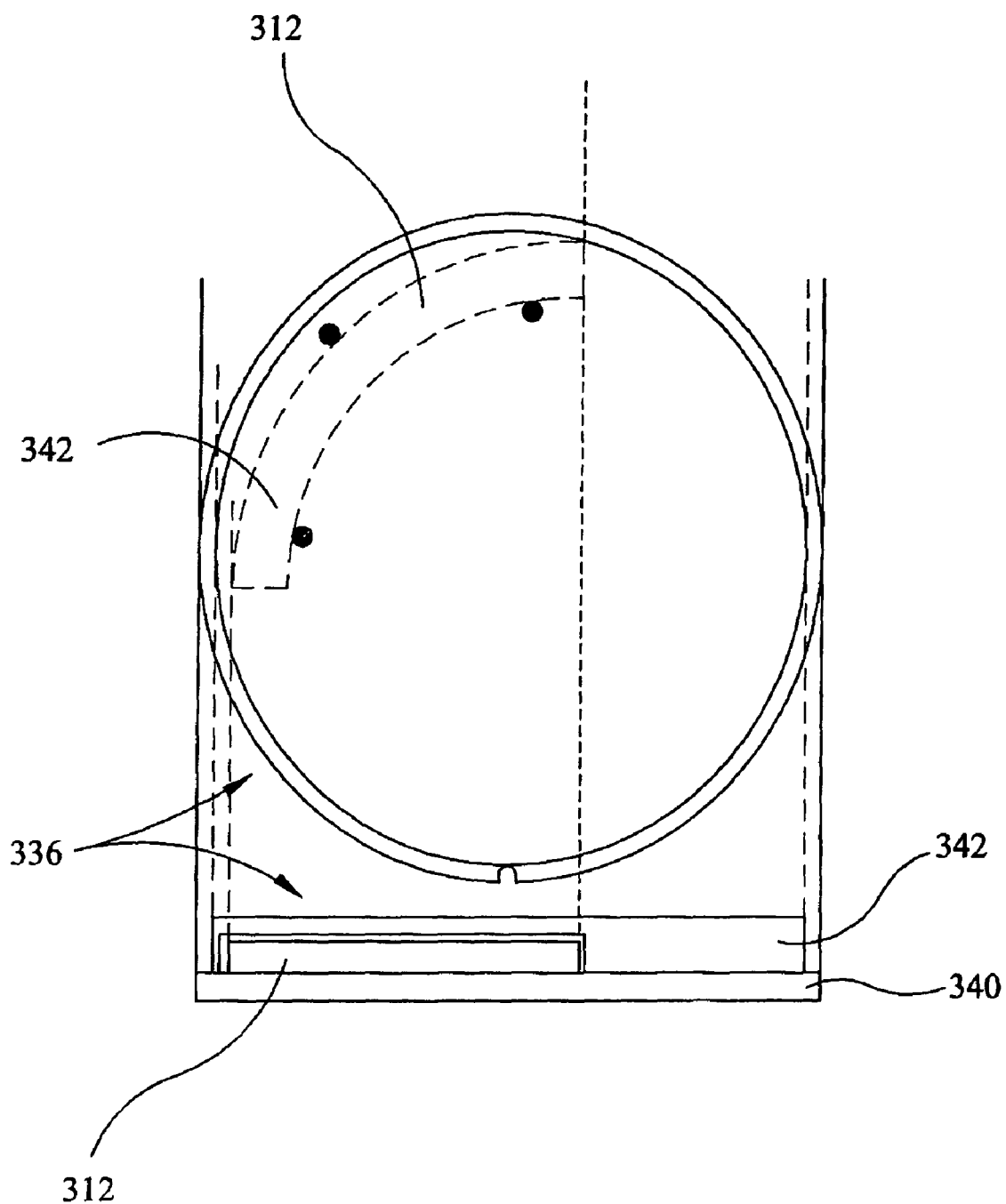

FIG. 5 shows the mask carrier arrangement in plan view. The mask carrier 336 has a base 340, for carrying the mask 312, and a cover 342 for covering the mask 312, during loading and unloading thereof. In this example the mask is a blade-like shape. However, it will be appreciated that the mask may be of a different shape depending on the mask application.

Referring again to FIG. 4, the mask loader 320 further comprises a suspension plate 344 disposed above, and spaced apart from, the substrate table, such that the arm 334 and the carrier 336 can rotate into the space therebetween. The suspension plate 344 has a pair of cover vacuum actuators, 346 and 348, and a mask vacuum actuator 350.

The apparatus 300 further comprises first and second pins, 352 and 354, respectively. Each pin is disposed within the substrate table 302 and upwardly extendible therefrom towards the suspension plate 344. Each of the first and second pins has a distal end having a vacuum actuator 356 and 358, respectively (shown in FIG. 6).

Also, disposed to the side of the substrate table 302 is a mask position adjuster 360 for moving a loaded mask into the desired non-exposure region.

Figure 6:
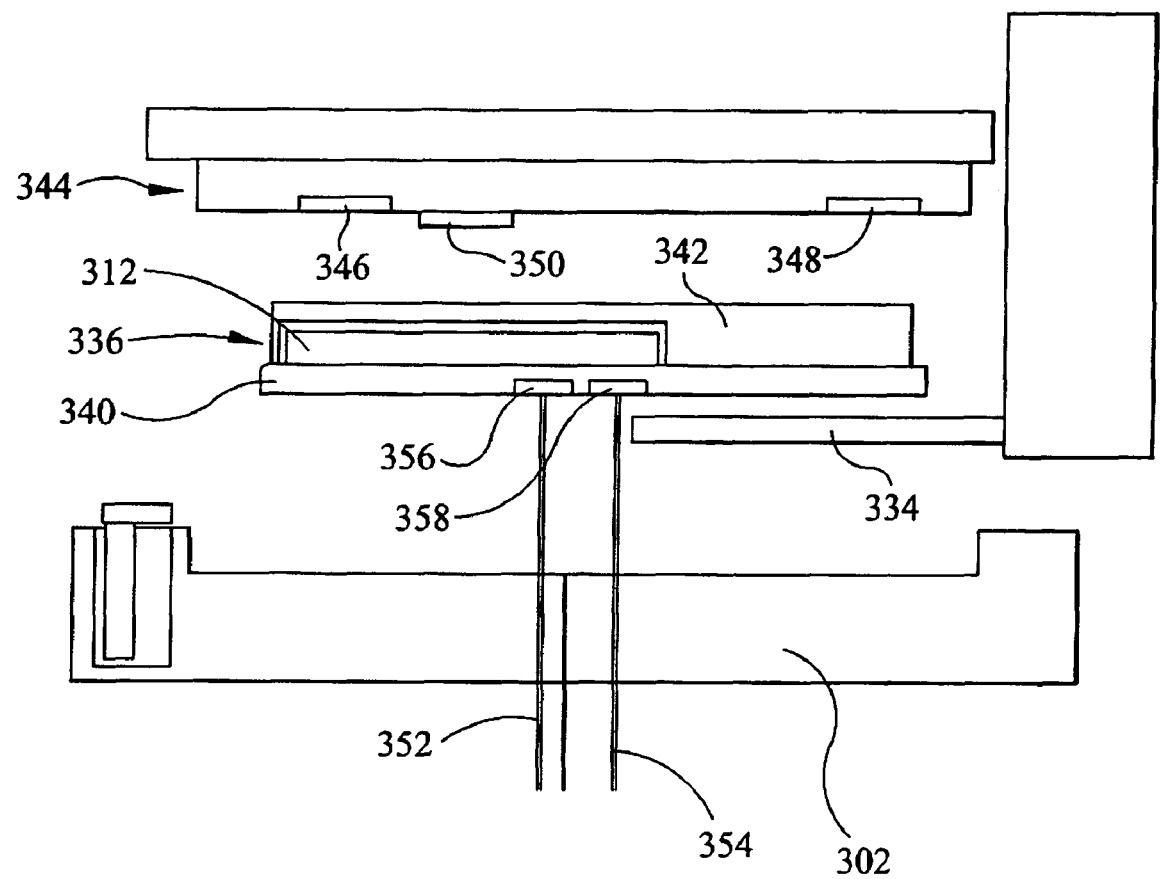

Referring to FIG. 6, in use, the apparatus, according to the third embodiment of the present invention, loads a desired mask 312 by initially selecting the appropriate carrier 336 in which the desired mask 312 is housed. The selected carrier 336 is loaded onto the arm 334 remote from the substrate table 302 and the arm vacuum actuator 338 is actuated, thereby attaching the carrier to the arm. The upright member 330 is then rotated to position the selected carrier 336, carried by the arm 334, above the substrate table 302.

Upon the carrier 336 being located above the substrate table 302, the first and second pins 352 and 354 extend upwardly from the substrate table 302 until they contact the underside of the mask carrier 340. Once contact has been made, the first and second pin vacuum actuators 356 and 358 are actuated which attaches the carrier 340, and therefore the carrier 336, to the pins 352 and 354. The arm vacuum actuator can then be switched off and the carrier 336 is detached from the arm 334.

Figure 7:
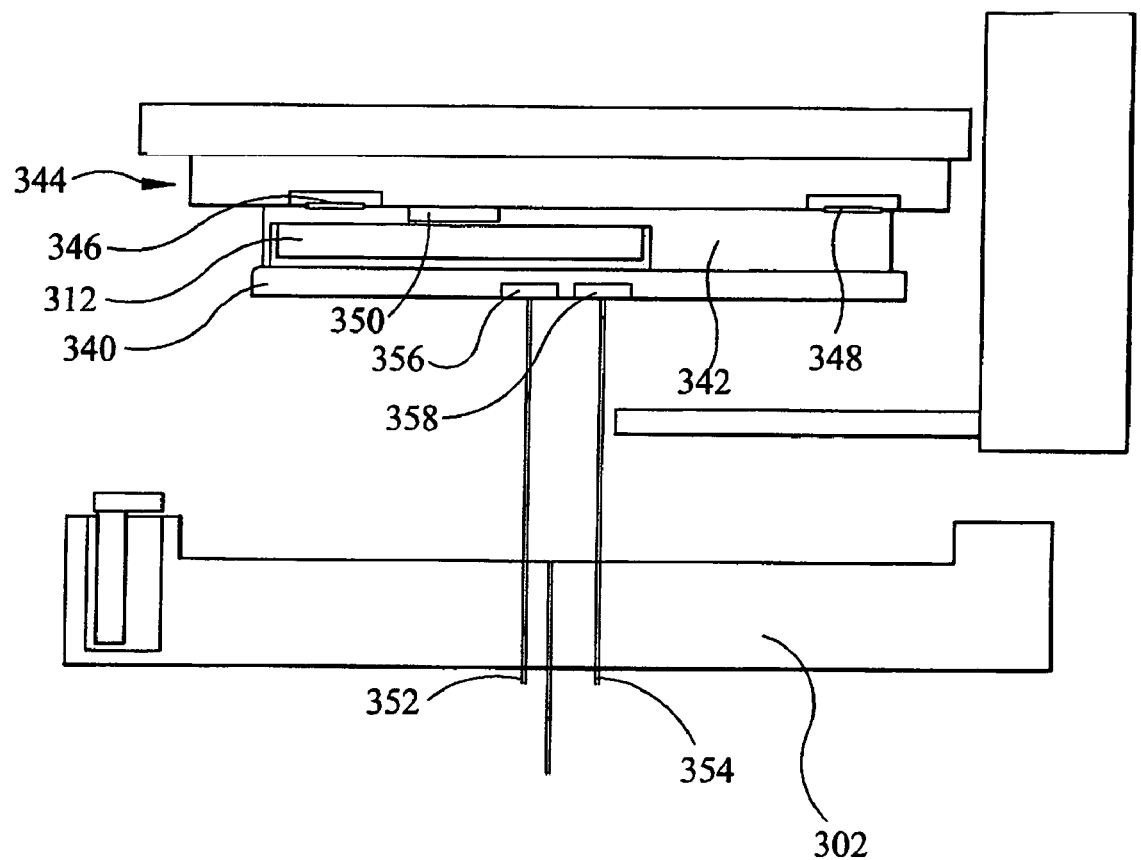

The pins, 352 and 354, are then extended further upwardly thereby carrying the carrier 336 upwards until the upper surface of the carrier (i.e. the upper surface of the cover 342) contacts the suspension plate 344. Upon the carrier contacting the suspension plate, the pair of cover vacuum actuators 346 and 348, disposed thereon, are actuated thereby attaching the cover 342 and the suspension plate 344. The mask vacuum actuator 350 is also actuated thereby attaching the mask 312 and the suspension plate 344 as shown in FIG. 7.

Figure 8:
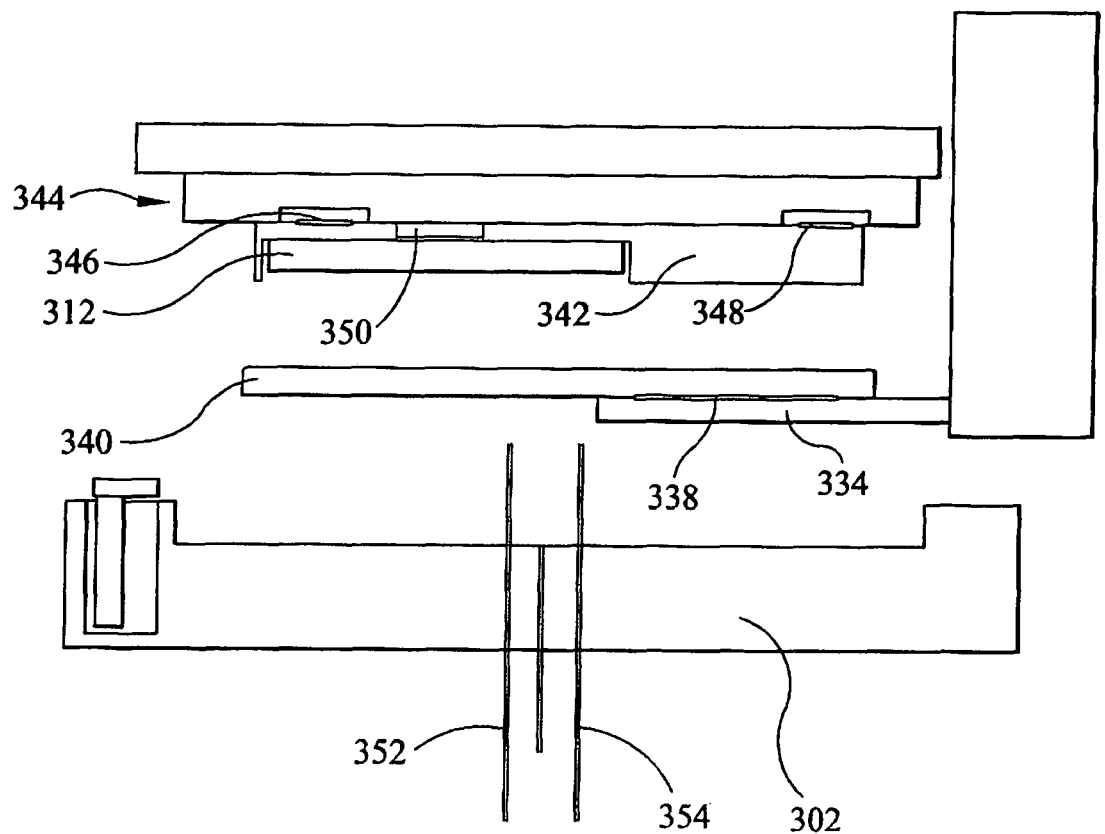

Referring to FIG. 8, the pins 352 and 354 are withdrawn back into the substrate table 302 thereby separating the base 340 from the mask cover 342. The pins are withdrawn until the lower surface of the base 340 contacts the arm 334. The arm vacuum actuator 338 is actuated thereby attaching the base 340 to the arm 334. The first and second pin vacuum actuators, 356 and 358, are switched off thereby detaching the base 340 from the pins 352 and 354. The pins, 352 and 354, are withdrawn further into the substrate table 302, thereby depositing the base 340 on the arm 334.

Figure 9:
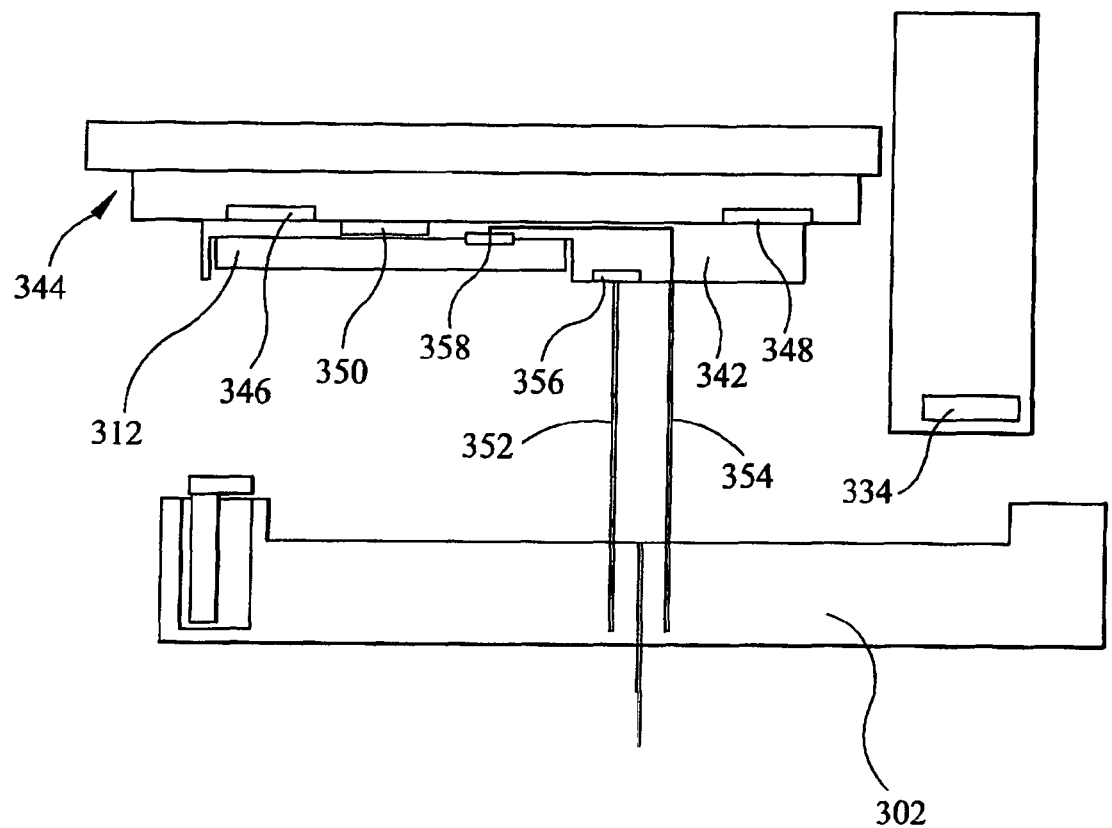

Referring to FIG. 9, the arm 334 is rotated to clear the space between the substrate table 302 and the suspension plate 344. The substrate table 302 is then moved laterally relative to the suspension plate 344, such that the pins, 352 and 354, align eccentrically with the substrate cover 342. The pins are extended again to contact the underside of the cover 342. The alignment of the substrate table relative to the cover allows the first pin 352 to attach to the cover 342 and the second pin to attach to the mask 312, by way of the first and second pin vacuum actuators 356 and 358, respectively. The first and second pin vacuum actuators 356 and 358 are actuated such that the cover 342 is attached to the first pin 352 and the mask 312 is attached to the second pin 354. The pair of cover vacuum actuators 346 and 348, disposed on the suspension plate 344, are switched off thereby detaching the cover 342 and the mask 312 therefrom.

Figure 10:
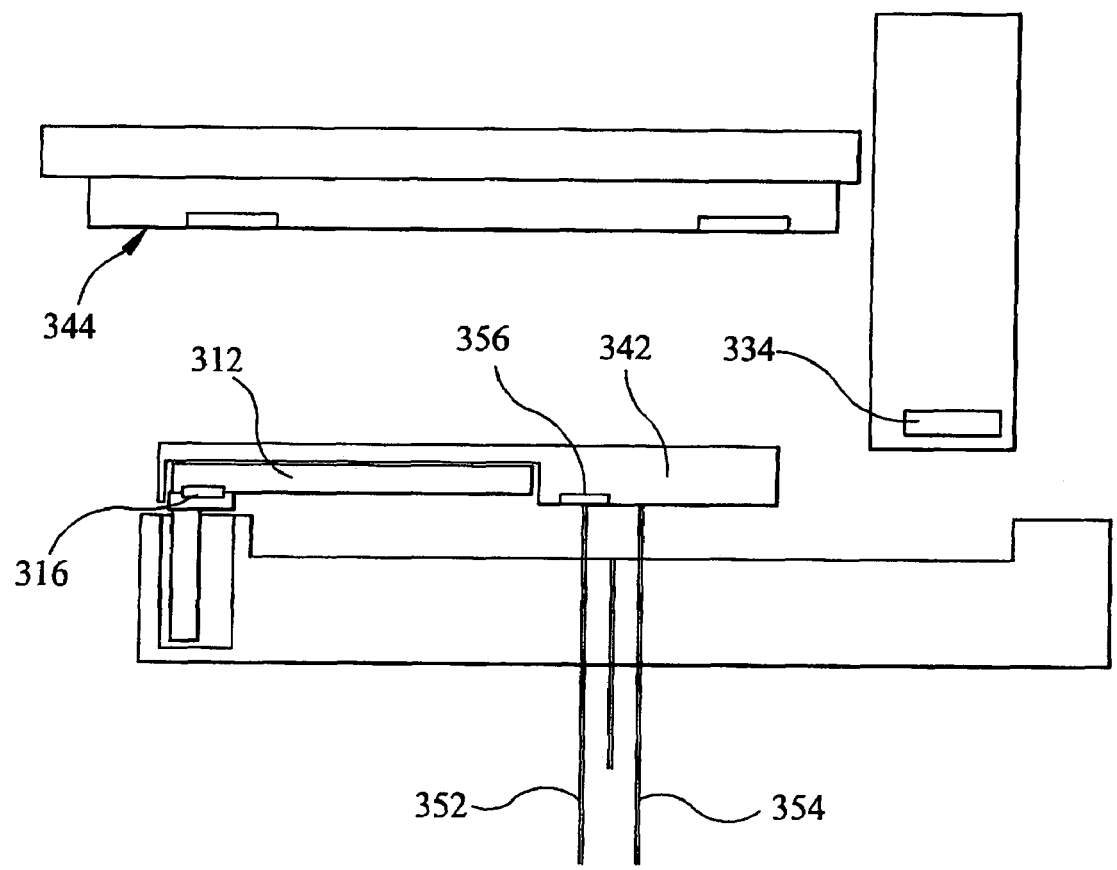

Referring to FIG. 10, the pins, 352 and 354, are withdrawn into the substrate table 302, thereby lowering the cover 342 and the mask 312 until a portion of the underside of the mask contacts the mask vacuum clamp 316. The mask vacuum clamp is actuated, thereby clamping the mask thereto. The second pin vacuum actuator 358 is switched off, thereby detaching the mask from the second pin 354.

Figure 11:
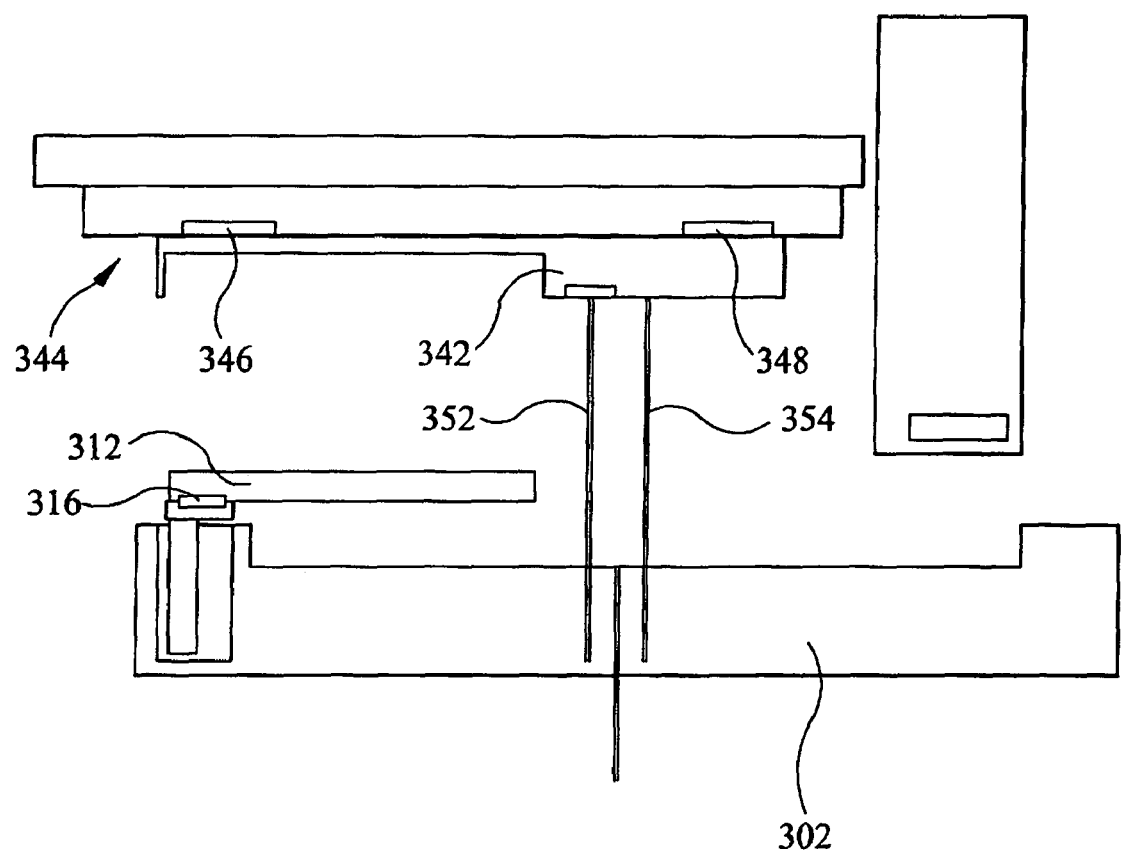

Referring to FIG. 11, the first and second pins, 352 and 354, are again extended from the substrate table 302 and the cover 342 is lifted until the upper surface thereof contacts the suspension plate 344. The pair of cover vacuum actuators 346 and 348, disposed on the suspension plate 344, are actuated thereby attaching the cover 342 to the suspension plate 344. The mask 312 remains clamped to the mask vacuum clamp 316.

Figure 12:
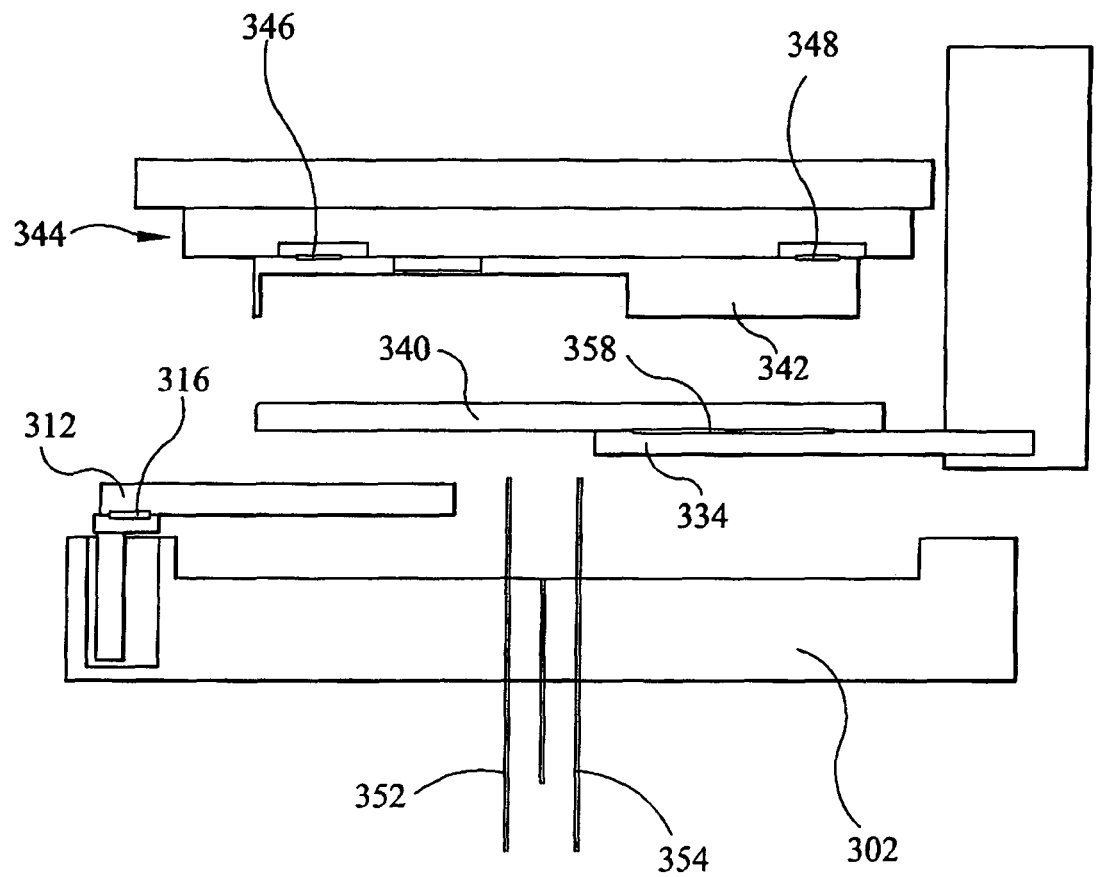

Referring to FIG. 12, the first and second pin vacuum actuators 356 and 358 are switched off, thereby detaching the cover 342 from the pins, 352 and 354. The pins are subsequently withdrawn into the substrate table 302 to provide space for the arm 334 to be rotated in between the substrate table 302 and the suspension plate 344. The arm 334 is rotated such that the base 340, attached thereto, is positioned directly below the suspended cover 342.

The pins, 352 and 354, are again extended from the substrate table 302 upwardly towards the suspension plate 344 until they contact the base 340, disposed on the arm 334. Upon contact with the base 340, the first and second pin vacuum actuators 356 and 358 are actuated such that the carrier is attached to the pins. The arm vacuum actuator 358 is switched off thereby detaching the base 340 from the arm 334.

The pins, 352 and 354, are extended further towards the suspension plate 344 such that the base 340 engages the cover 342, to reconstruct the carrier 336. Upon engagement of the cover with the base, the pair of cover vacuum actuators 346 and 348, disposed on the suspension plate 344, are switched off thereby detaching the cover 342 from the suspension plate 344.

Figure 13:
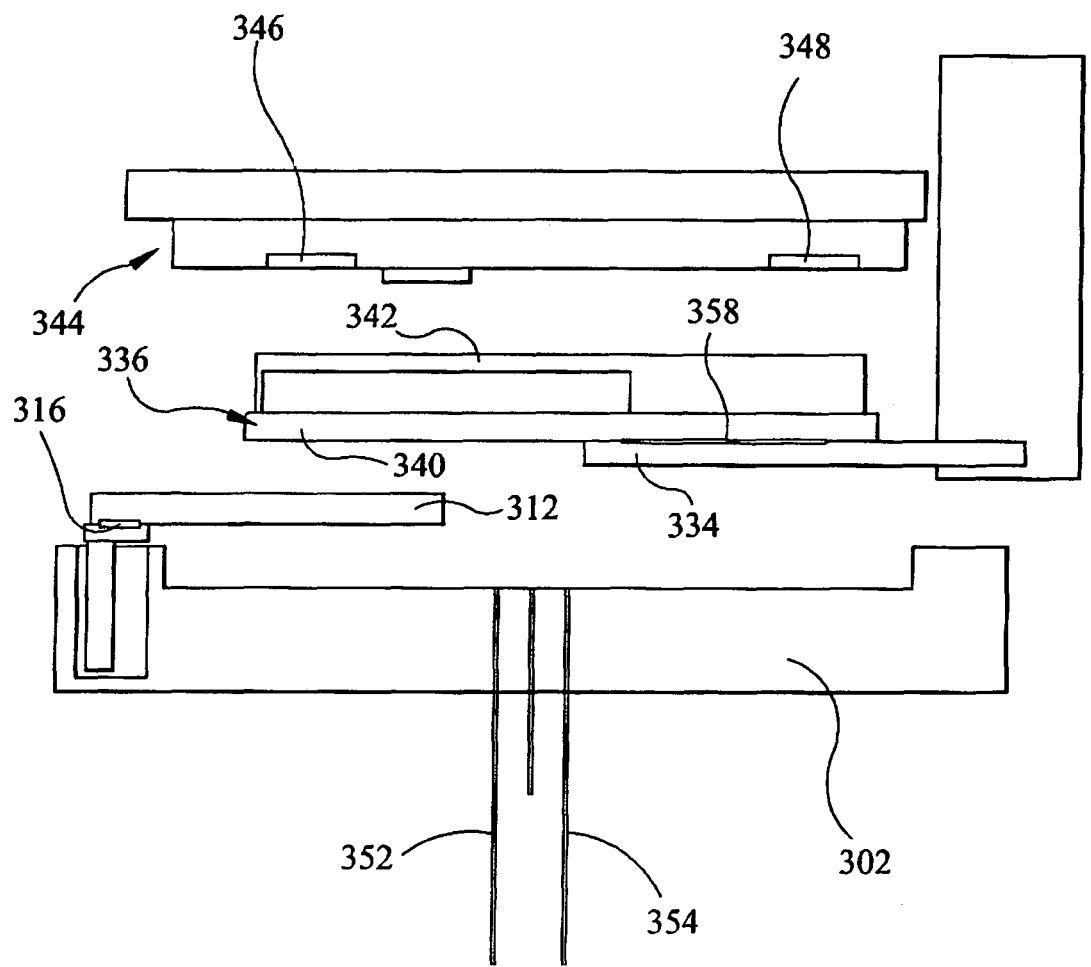

The pins, 352 and 354, are then partially withdrawn into the substrate table 302 until the underside of the base 340 again contacts the arm 334. Upon the base contacting the arm, the arm vacuum actuator 358 is actuated thereby attaching the carrier 336 to the arm 334. The first and second pin vacuum actuators 356 and 358 are switched off thereby detaching the carrier 336 from the pins. The pins are subsequently withdrawn into the substrate table 302 having deposited the carrier 336 on the arm 334, as shown in FIG. 13.

The arm 334 is subsequently rotated to remove the carrier 336 from the area directly above the substrate table.

In its loaded position, the mask 312 may be moved radially and circumferentially relative to the substrate table 302 by actuating the mask position adjuster 360.

Figure 14:
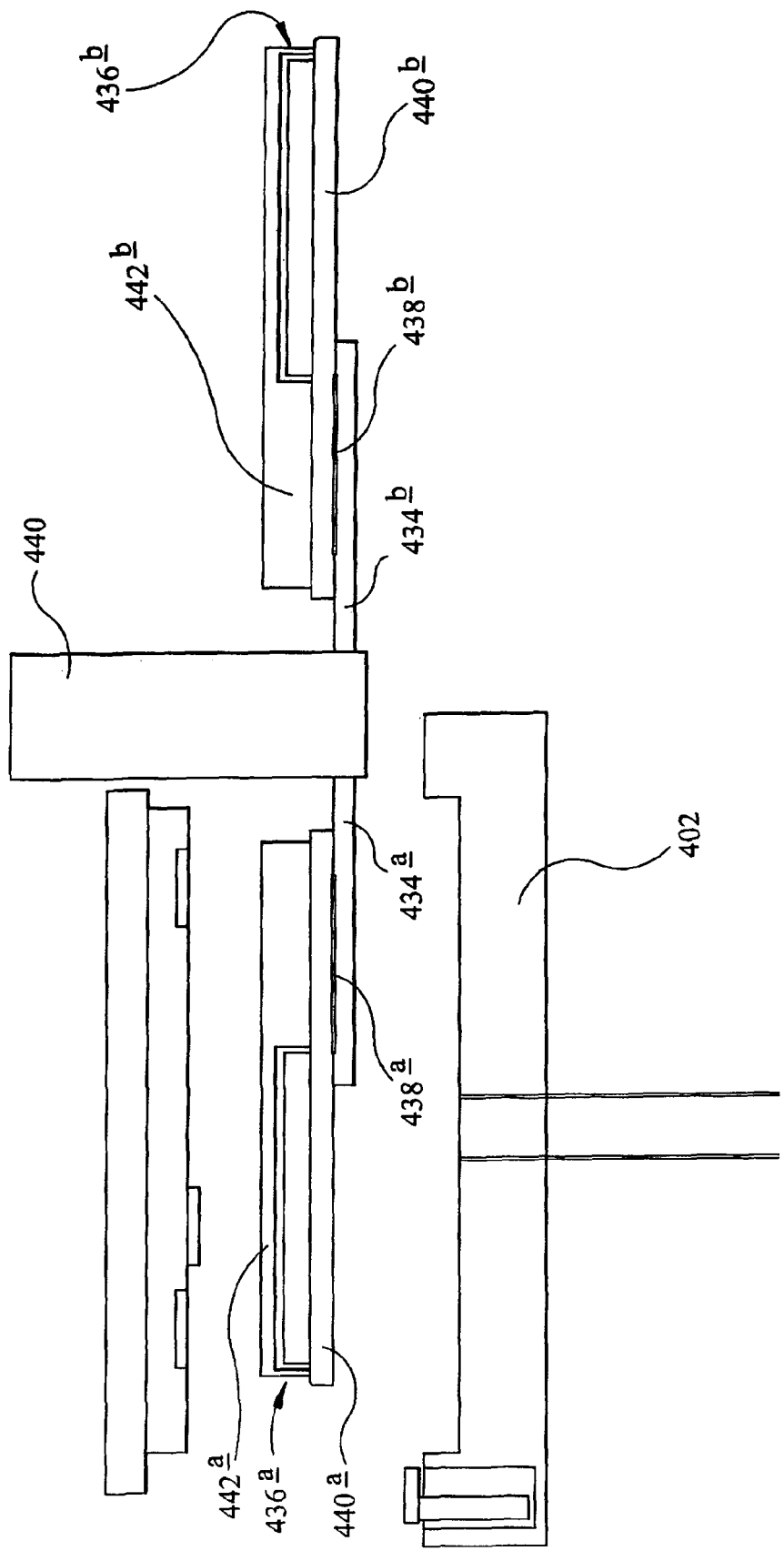
FIG. 14 is a schematic drawing of a fourth embodiment of masking apparatus, and a method of masking, according to the present invention.

Referring to FIG. 14, a fourth embodiment of apparatus 400, according to the present invention, is identical to the third embodiment described above except that the upright member 430, of the mask loader 420, has a first arm 434a extending radially outwards therefrom and a second arm 434b extending radially outwards therefrom. The first and second arms are diametrically opposed relative to each other. The arms 434a and 434b are independently located above the substrate table by rotating the upright member 430.

The mask loader 420 further comprises a first and second mask carriers 436a and 436b. Each mask carrier, 436a and 436b, is disposed on an upper side of the associated arm 434a and 434b and is held in position on the relevant arm by first and second vacuum actuators 438a and 438b, respectively.

Each carrier 436a and 436b has a base 440a and 440b, respectively, and a cover 442a and 442b, respectively. Each carrier 436a and 436b is adapted to carry different sized or shaped masks such that one size or shape may be interchanged with another.

It will be appreciated that the mask loader may have more than two arms and associated carriers as needed, depending on the application, within the working of the present invention. The mask loader may be different in form. The mask loader may for example be a robot or robot-like structure similar to those already used to handle substrates in conventional lithographic apparatus.

While specific embodiments of the invention have been described above, it will be appreciated that the invention may be practiced otherwise than as described. The description is not intended to limit the invention.

What is claimed is:

1. A method of loading a peripheral exposure exclusion mask into a lithographic apparatus, the method comprising:
   delivering a carrier containing the mask into the lithographic apparatus;
   removing the mask from the carrier;
   positioning the mask relative to a substrate table of the lithographic apparatus so that the mask will prevent a peripheral region of a substrate from being exposed during subsequent lithographic patterning of the substrate;
   holding a cover of the carrier and the mask with one or more actuators located in a suspension plate disposed above the substrate table,
   removing a base of the carrier with a mask loader;
   extending a plurality of pins from the substrate table so that the pins contact the carrier cover;
   lowering the pins so that the carrier cover and the mask are lowered, until the mask comes into contact with a substrate table actuator;
   securing the mask to the substrate table actuator;
   raising the carrier cover to the suspension plate with the plurality of pins; and
   removing the carrier cover.

2. The method of claim 1, wherein the carrier cover and the carrier base are reunited before the carrier is removed.

3. A lithographic apparatus comprising:
   a projection system arranged to project patterned radiation onto a substrate;
   a substrate table arranged to support the substrate;
   a mask arranged to form a peripheral exposure exclusion region on the substrate;
   one or more actuators located in a suspension plate disposed above the substrate table, the actuators being arranged to be releasably attached to a cover of a carrier for the mask and to the mask; and
   a plurality of pins provided in the substrate table, the pins being extendable in a direction perpendicular to a surface of the substrate table, and being arranged to be releasably attached to the carrier cover, wherein the pins are arranged to provide a vacuum at their distal ends.

4. The lithographic apparatus of claim 3, wherein the carrier cover includes a channel arranged to connect the mask to the vacuum provided by at least one of the pins.

5. The lithographic apparatus of claim 3, further comprising a substrate table actuator arranged to releasably secure the mask to the substrate table.

* * * * *